US008995589B1

(12) United States Patent
Qiu

(10) Patent No.: US 8,995,589 B1
(45) Date of Patent: Mar. 31, 2015

(54) CHANNEL ESTIMATION IN A PILOT ASSISTED OFDM SYSTEM

(76) Inventor: James Qiu, Carlsbad, CA (US)

(*) Notice: Subject to any disclaimer, the term of this patent is extended or adjusted under 35 U.S.C. 154(b) by 519 days.

(21) Appl. No.: 13/291,968

(22) Filed: Nov. 8, 2011

Related U.S. Application Data

(60) Provisional application No. 61/414,811, filed on Nov. 17, 2010.

(51) Int. Cl.
*H03K 9/00* (2006.01)
*H04L 27/06* (2006.01)
*H04B 1/10* (2006.01)
*H03L 7/099* (2006.01)

(52) U.S. Cl.
CPC ..................................... *H03L 7/099* (2013.01)
USPC ............ 375/346; 375/316; 375/342; 375/350

(58) Field of Classification Search
USPC ................. 375/229–236, 316, 295, 211, 219, 375/240.26–240.29, 340, 346, 347, 350, 375/220, 222
See application file for complete search history.

(56) References Cited

U.S. PATENT DOCUMENTS

| | | | | |
|---|---|---|---|---|
| 7,064,613 | B2* | 6/2006 | Kolsrud et al. | 330/296 |
| 8,275,053 | B2* | 9/2012 | Bang et al. | 375/260 |
| 2003/0179048 | A1* | 9/2003 | Kolsrud et al. | 330/296 |
| 2004/0178853 | A1* | 9/2004 | Barak | 330/302 |
| 2005/0276364 | A1* | 12/2005 | Black et al. | 375/354 |
| 2006/0114075 | A1* | 6/2006 | Janosevic et al. | 332/150 |
| 2008/0084817 | A1* | 4/2008 | Beckman et al. | 370/210 |
| 2008/0101483 | A1* | 5/2008 | Aziz | 375/260 |
| 2008/0101490 | A1* | 5/2008 | Kawauchi et al. | 375/260 |
| 2008/0130771 | A1* | 6/2008 | Fechtel et al. | 375/260 |
| 2009/0110044 | A1* | 4/2009 | Wu et al. | 375/231 |
| 2009/0141841 | A1* | 6/2009 | Dateki | 375/346 |
| 2009/0252112 | A1* | 10/2009 | Shimomura et al. | 370/330 |
| 2009/0323666 | A1* | 12/2009 | Malladi et al. | 370/345 |
| 2010/0054371 | A1* | 3/2010 | Namgoong et al. | 375/340 |
| 2010/0067627 | A1* | 3/2010 | Lincoln et al. | 375/346 |
| 2010/0142659 | A1* | 6/2010 | Gold-Gavriely et al. | 375/343 |
| 2010/0177251 | A1* | 7/2010 | Kimura et al. | 348/726 |
| 2010/0223522 | A1* | 9/2010 | Duggan | 714/748 |
| 2010/0310016 | A1* | 12/2010 | Okehie et al. | 375/340 |
| 2011/0142118 | A1* | 6/2011 | Seo et al. | 375/229 |
| 2011/0274220 | A1* | 11/2011 | Andgart et al. | 375/342 |
| 2012/0063529 | A1* | 3/2012 | Choi et al. | 375/267 |
| 2012/0087428 | A1* | 4/2012 | Martinez | 375/260 |

* cited by examiner

*Primary Examiner* — Sam K Ahn
*Assistant Examiner* — Linda Wong
(74) *Attorney, Agent, or Firm* — Kilpatrick Townsend & Stockton LLP

(57) ABSTRACT

An accurate channel frequency response is obtained by processing an extracted number of pilot tones provided at different locations within a received OFDM symbol. This includes filtering the extracted pilot tones with a first window function, converting the thus filtered pilot tones to a first channel impulse response signal that may include a main tap and a plurality of adjacent taps, removing taps whose absolute values or energy levels are below a predetermined level, processing the remaining taps having sufficient absolute values or energy levels into a second channel impulse response signal that is significantly free of noises, converting the second channel impulse response signal to a frequency-domain signal, and filtering the frequency-domain signal with a second window function having an inverse characteristic of that of the first window function to obtain an accurate channel frequency response.

21 Claims, 6 Drawing Sheets

CHANNEL ESTIMATION IN A PILOT ASSISTED OFDM SYSTEM

CROSS-REFERENCE TO RELATED APPLICATIONS

The present application claims benefit under 35 USC 119 (e) of U.S. provisional application No. 61/414,811, filed Nov. 17, 2010, entitled "Channel Estimation in a Pilot Assisted OFDM System," the content of which is incorporated herein by reference in its entirety for all purposes.

BACKGROUND OF THE INVENTION

The present invention relates to digital communications using Orthogonal Frequency Multiplexing (OFDM) technique. More particularly, the invention relates to channel estimation in OFDM systems.

Signal processing systems such as communication receivers often must recover a desired signal that has been transmitted through a channel and is degraded under the influence of multipath and the like during the transmission. In order to compensate for the signal impairment introduced thereby, receivers can use signal processing techniques to estimate the channel conditions.

OFDM communications systems are widely used for transmitting digital information. Current OFDM systems are, for example, Digital Audio Broadcasting (DAB), Digital Video Broadcasting such as DVB-Terrestrial (DVB-T), Integrated Services Digital Broadcasting-Terrestrial (ISDB-T), and Wireless Local Area Network (WLAN) such as IEEE 802.11a/b/g/n.

In an OFDM system, a number of subcarriers is independently modulated. The modulation can be Quadrature Amplitude Modulation (QAM) or Phase shift Keying (PSK). The baseband signal in an OFDM system includes multiple OFDM symbols, each OFDM symbol contains a predetermined number of sub-carriers with the majority of the sub-carriers designated to carry user data and some subcarriers designated to carry pilot signals. The data sub-carriers are hereinafter referred as "data carriers" and the pilot subcarriers are hereinafter referred as "pilot tones." Pilot tones are dispersed or scattered among the data carriers within an OFDM symbol. Pilot tones have known frequencies and phase modulation to provide a phase reference for data carriers in the OFDM symbol for improving the accuracy of the signal demodulation at the receiver. Pilot tones are generally spaced apart in frequency by an amount that permits the channel response of carriers lying in-between the pilot tones to be accurately estimated by interpolating the channel responses determined for the pilot tones.

FIG. 2 is a high level block diagram of an OFDM channel estimation device 200, as known in the prior art. OFDM channel estimation device 200 includes a discrete Fourier Transform block 212 that converts a time-domain digital baseband signal D0 to a frequency-domain signal D1 having at least one OFDM symbol. The OFDM symbol is the sum of data carriers and pilot tones. A pilot tone extractor 222 picks out the pilot tones and provides a channel frequency response D2 at its output. FIG. 3 illustrates an exemplary waveform diagram of the extracted pilot tones. An inverse discrete Fourier Transform block 232 converts the channel frequency response D2 to a channel impulse response signal D3. The channel impulse response signal D3 may include a time-domain signal having one or more peaks that represent a more or less direct received signal and multiple delayed signals caused by the multipath. The one or more peaks may have non-negligible energy levels and can be a measure of the delay spread, which is interpreted as the difference between the time of arrival of the first significant multipath component and the time of arrival of the last multipath component. The channel impulse response signal D3 may include other multipath signals whose energy levels are not significant and will be removed in a subsequent noise removal block 242. The noise-reduced channel impulse response D4 is then fed to a second discrete Fourier Transform block 252 that converts the channel impulse response D4 to a final channel frequency response D5 that is representative of the "real" channel characteristic.

FIGS. 3 to 5 illustrate the magnitude spectrum of data outputs at different stages of the OFDM channel estimation device 200. FIG. 3 is a waveform diagram showing the extracted pilot tones from a received OFDM symbol at the output of the pilot extractor block 222. The x-axis is shown in frequency (Hz), and the y-axis is given for a normalized power spectrum density (PSD) in dB.

FIG. 4 is a channel impulse response signal D4 at the output of the noise removal block 242. Channel impulse response signal D4 contains most of the channel impulse energy with much reduced noise level. The x-axis is shown in delay time unit (ns) and the y-axis is given for a PSD in dB.

FIG. 5 is an estimated channel frequency response signal D5 at the output of the second discrete Fourier Transform block 252. The x-axis is shown in frequency (Hz) and the y-axis is shown for a PSD (dB).

FIG. 6 is a waveform showing the error of the estimated channel frequency response against a 0 dB AWGN channel (ideal channel), as known in the prior art.

BRIEF SUMMARY OF THE INVENTION

According to the present invention, techniques for channel estimation in an OFDM system are provided. More particularly, the invention provides methods and systems for estimating a channel in a pilot assisted OFDM system, but it is recognized that the invention has a much broader range of applicability.

In a specific embodiment, the present invention provides a computer-implemented method that estimates a channel in a pilot assisted OFDM system. The computer-implemented method includes receiving an RF signal, down-converting the RF signal to obtain a baseband signal, and converting the baseband signal into a digital (i.e., time-domain) baseband signal. The digital baseband signal is processed into a frequency-domain signal that contains an OFDM symbol having a number of data carriers and a number of pilot tones. At least a subset of pilot tones is then extracted from the OFDM symbol and processed with a first window function. In a specific embodiment, the first window function can be a Hann Window function. The filtered pilot tones are then transformed to obtain a channel impulse response. The transformation includes an inverse discrete Fourier Transform or an inverse Fast Fourier Transform. The obtained channel impulse response may include a main tap and a plurality of adjacent taps disposed at both sides of the main tap. The method includes converting each tap into a positive value and removing taps that have a value lower than a predetermined level. In a specific embodiment, the removal of the taps is performed by windowing and thresholding, where the amount of taps removal is controlled by a threshold level and a width of a window. In an embodiment, only a channel impulse response can be obtained. The method further includes transforming the channel impulse response to a channel frequency signal. Additionally, the method includes filtering the frequency-domain signal with a second window function to produce an estimate channel frequency response. In a specific embodiment, the second window function is an inverse function of the first window function so that the product of the first and second window functions is substantially equal to unity.

According to an embodiment of the present invention, an OFDM receiver is provided to include an RF front-end module having an input coupled to an antenna and being configured to receive an RF signal and an output for outputting a baseband signal. The OFDM receiver includes an analog-to-digital converter that receives the baseband signal and converts the baseband signal into a digital baseband signal. The OFDM receiver further includes a digital signal processing module that comprises a frequency-domain converter configured to convert the digital signal into a frequency-domain signal that may include an OFDM symbol having a plurality of data carriers and a plurality of pilot tones. The digital signal processing module further includes a pilot tone extractor configured to extract at least a subset of pilot tones from the OFDM symbol, a first window function configured to provide a first set of weighting parameters to the extracted subset of pilot tones, a time-domain converter configured to obtain a channel impulse response from the weighted pilot tones, the channel impulse response may have a plurality of taps. The digital signal processing module also includes a noise removal circuit configured to remove taps from the plurality of taps that have a magnitude value less than a predetermined level. Additionally, the digital signal processing module includes a channel frequency estimator configured to estimate a channel frequency response associated with the remained taps that have not been removed from the noise removal circuit; and a second window function configured to filter the estimated channel frequency response with a second set of weighting parameters. In a specific embodiment, the second window function is an inverse of the first window function so that the product of the first and second window functions is substantially equal to unity.

According to another embodiment of the present invention, a digital signal processor including a memory is provided for a channel estimation. The digital signal processor includes an input configured to receive a digital signal, which may be a digital representation of a baseband signal. The digital signal processor further includes machine readable and executable program codes stored in the memory, wherein when executed cause the digital signal processor to transform the digital signal into a frequency-domain signal, where the frequency-domain signal includes an OFDM symbol having a plurality of data carriers and a plurality of pilot tones, extract at least a subset of pilot tones from the OFDM symbol, filter the extracted pilot tones using a first window function, and obtain a channel impulse response from the filtered pilot tones, where the channel impulse response may include a plurality of taps. The digital signal processor further executes the program codes to select a number of taps from the plurality of taps, where each of the selected number of taps has a magnitude value being equal to or greater than a predetermined magnitude level, convert the selected taps into a channel frequency response, and filter the channel frequency response with a second window function. The digital signal processor further includes an output configured to output the filtered channel frequency response. In an embodiment, the second window function is an inverse function of the first window function so that the product of the first and second window functions is substantially equal to unity.

According to yet another embodiment of the present invention, a device is provided for estimating a channel response from a received signal that includes a number of pilot tones in an OFDM communication system. The device includes logic for converting the received signal into a frequency-domain signal, logic for extracting a portion or the entire number of pilot tones, logic for filtering the number of pilot tones with a first filter function, logic for converting the filtered pilot tones into a channel impulse response, logic for removing noises from the channel impulse response, logic for generating a channel frequency response, and logic for filtering the channel frequency response with a second filter function. In a specific embodiment, the pilot tones are spaced apart in frequency by an amount within an OFDM symbol. In yet another specific embodiment, the pilot tones are scattered at an equal frequency distance within an OFDM symbol.

Embodiments of the present invention provide many benefits and advantages over conventional techniques. For example, the present invention provides methods and systems of reducing the signal loss while suppressing the unnecessary spectral leakage. In an embodiment, pilot tones are extracted from a received OFDM symbol and processed with a window function before being transformed to a time-domain signal, which is representative of a channel impulse response signal, where a significant portion of the spectral energy is contained in a main or center tap. This is achieved by means of a steep roll-off of the spectral waveform to reduce spectral leakage. These and other benefits will be described in more detail throughout the present specification and more particularly below.

Various features and advantages of the present invention can be more fully appreciated with reference to the detailed description and accompanying drawings that follow.

DETAILED DESCRIPTION OF THE INVENTION

The present invention provides a method and apparatus for estimating a channel frequency response in pilot tones assisted OFDM systems.

Figure 1:
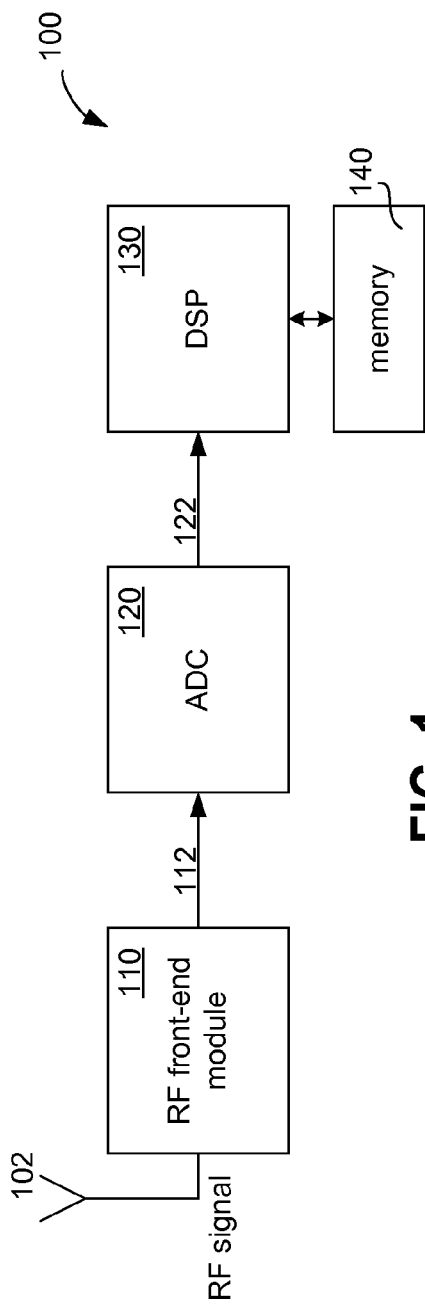
FIG. 1 is a high-level block diagram of an OFDM receiver system that may be used for embodiments of the present invention.
Figure 2:
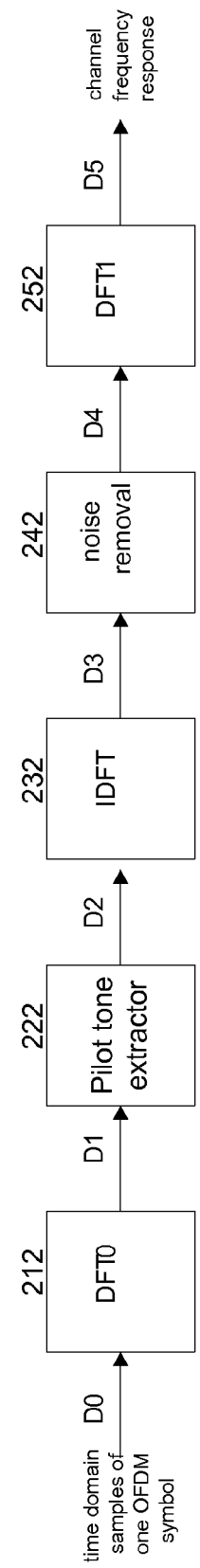
FIG. 2 is a functional block diagram illustrating the processing stages of an OFDM channel estimation device, as known in the prior art.
Figure 3:
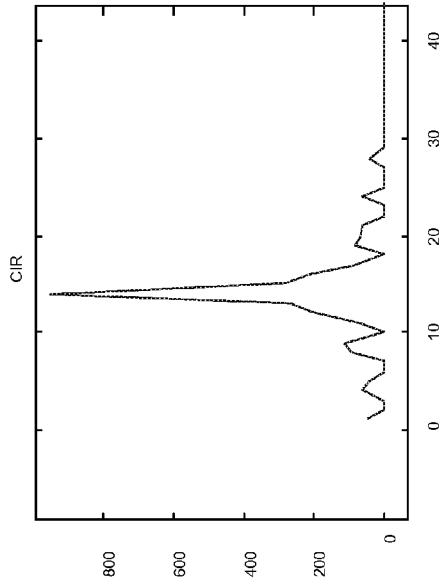
FIG. 3 is a diagram illustrating the extracted pilot tones at the output of the pilot extractor of FIG. 2, as known in the prior art.

FIG. 1 is a high-level block diagram of an OFDM receiver 100. A radio frequency (RF) front-end module 110 includes an input coupled to an antenna 102 and configured to down-convert an RF signal to a baseband signal 112. The RF signal may be a television broadcast signal, a cellular radio signal or a wireless or wired data signal. The receiver can be a direct conversion or a dual conversion receiver using a two stages frequency translation to down-convert the received RF signal to an intermediate frequency (IF) signal, a near-zero IF signal, or a zero-IF baseband signal. As used herein, the term baseband signal refers to baseband signals as well as to signals that are substantially baseband signals. A signal is substantially baseband signal if the frequency conversion process to down-convert a signal is imperfect, for example, due to LO errors or LO differences at the transmitter and the receiver. The term baseband signal can also be used to refer to a low IF signal or an IF signal that has a frequency substantially lower than the RF signal. The baseband signal can be an intermediate frequency (IF) signal, a near-zero IF signal, or a zero-IF signal.

The baseband signal includes at least one OFDM symbol having a plurality of data carriers and pilot tones. In general, a cyclic prefix or guard interval, which is a copy of a portion of an OFDM symbol and is added at the transmitter to protect against delay spreads (time dispersions) caused by multipath, is stripped off of the OFDM symbol. In an embodiment, the scattered pilot tones are spaced apart in equal frequency amount within the OFDM symbol.

The RF front-end module includes an output that is coupled to an analog-digital converter (ADC) module 120 that converts the baseband signal to a digital baseband signal 122. The digital baseband signal is then processed in a digital signal processing (DSP) module 130 that may perform time-domain to frequency-domain conversion and vice versa and other windowing functions. The DSP module 130 may also performs channel estimation and signal demodulation to retrieve the originally transmitted data. Receiver 100 further include a memory module 140 that is coupled to the DSP module and contains program instructions that, when executed, cause the DSP module to perform a variety of functions to accurately estimate a channel response.

Figure 7:
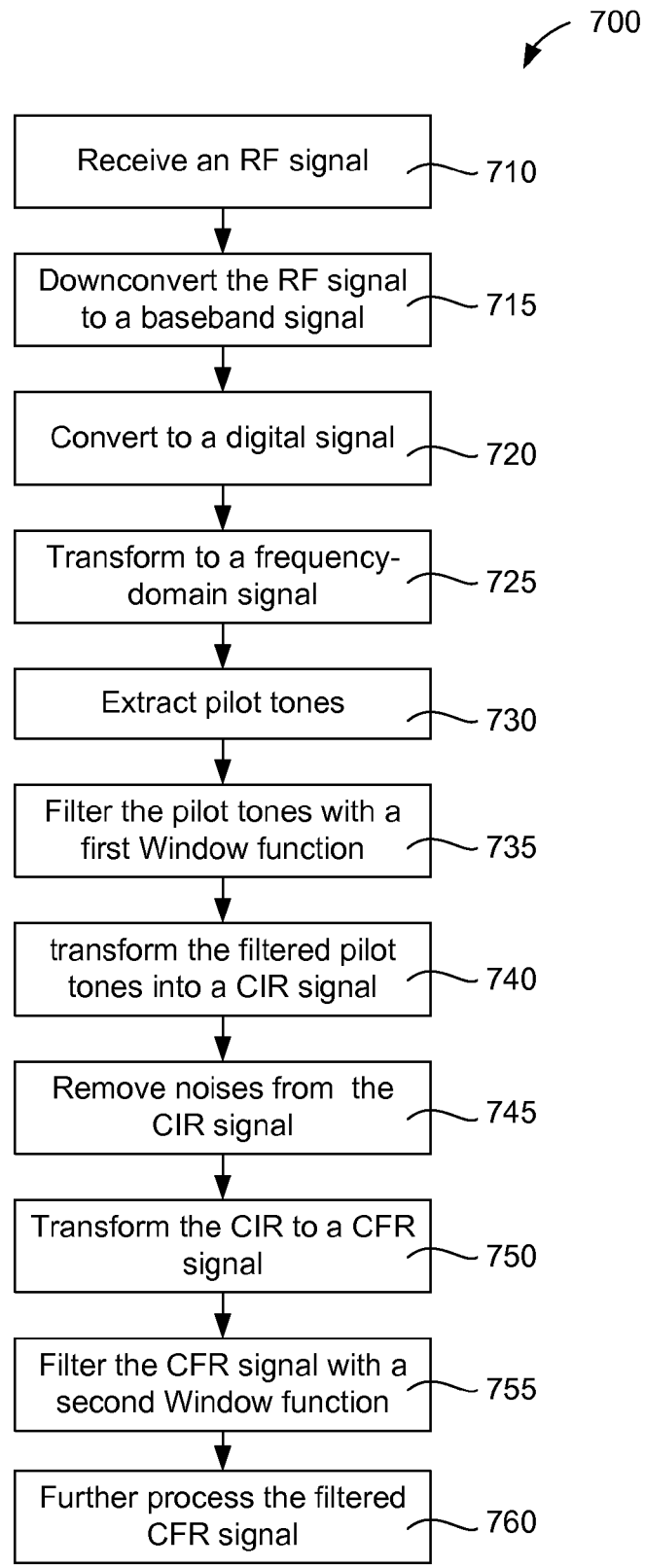
FIG. 7 is a flowchart of steps performed to estimate a channel in an OFDM system, in accordance with one embodiment of the present invention.

FIG. 7 is a simplified flowchart of steps of a computer-implemented method 700 for estimating a channel in a pilot assisted OFDM system, according to an embodiment of the present invention. The method 700 can be performed, for example, by the receiver 100 shown in FIG. 1.

The method 700 begins at 710 where an RF signal is received. The received RF signal is converted to a baseband signal at 715. The baseband signal is converted to a digital baseband signal at 720. The digital baseband signal is converted to a frequency-domain signal at 725. In an embodiment, the frequency-domain conversion may be performed using a discrete Fourier Transform operation or a Fast Fourier Transform operation.

At least a subset of pilot tones is extracted from the OFDM symbol at 730. The subset can include a portion of the pilot tones or the entire pilot pilots containing in the OFDM symbol. The extracted pilot tones (the subset or the entire pilot tones) in the OFDM symbol is then filtered with a first Window function at 735. The filtered pilot tones are then converted to a channel impulse response in the time domain at 740. The channel impulse response can be obtained using an inverse discrete Fourier transform or an inverse fast Fourier transform operation that can be performed by the digital signal processing module as shown in FIG. 1.

Noises from the channel impulse response signal are removed at 745. The noise free channel impulse response signal is then transformed back to a channel frequency response signal in the frequency domain at 750. The channel frequency response signal is then filtered by a second Window function at 755. The method then proceeds to block 760 and further processes the filtered channel frequency response signal.

In an embodiment, the receiver 100 of FIG. 1 does not need to receive all scattered pilot tones in the OFDM symbol. If some scattered pilot tones cannot be received due to a frequency-selective channel, the receiver can reconstruct the missing pilot tones by replacing them using the received adjacent pilot tones or by interpolating the received adjacent pilot tones.

The receiver filters the extracted pilot tones with a first window function to reduce the signal loss and noise in the channel estimate while suppressing spectral leakage. A window function is a mathematical function that has substantially zero value outside a predetermined interval. Within the predetermined interval, the window function can have many values (or shapes). Most known window functions are rectangular window, triangular window, bell-shaped window. In an embodiment, the first window function can be a Hann (aka. Hanning) Window function, a Hamming Window function, or the like. In a specific embodiment, the window function is a Hann Window function, which is also known as a Hanning Window function. In an embodiment, a Window function assigns a weight to the extracted pilot tones by multiplying them with a set of discrete value. The receiver transforms the thus weighted pilot tones into a time-domain signal, which is representative of a channel impulse response having a main or the largest tap and multiple adjacent taps at 740. For example, the channel taps following the main tap are the post-cursor taps while the channel taps preceding the main tap are the precursor taps. The receiver removes precursor and post-cursor taps that have energy or magnitude levels below a predetermined energy or magnitude level. In an embodiment, the taps can be removed at 745 using a noise limiter that may comprise a window separator centered around the main tap and having a width to pass through taps that are located around the main tap. In another embodiment, the noise limiter may comprise a threshold separator that passes through only taps having an energy or magnitude level greater than a predetermined energy or magnitude threshold. In yet another embodiment, a noise remover may comprise a combination of a window separator and a threshold separator, wherein the combined window and threshold separator forms a channel estimation window that only passes through the main tap and adjacent taps having sufficient energy or magnitude levels. The main tap and the adjacent taps with sufficient energy levels are then transformed into a frequency-domain signal that is an estimated channel frequency response signal at 750.

In an embodiment, the energy level of each tap can be calculated by squaring absolute values of a channel response of each tap.

The receiver further filters the estimated channel frequency response signal with a second window function to generate an accurate channel frequency response signal at 755. In a specific embodiment, the second window function may be an inverse of the first window function so that the product of the first and second window functions is substantially equal to unity. At 760, the thus filtered channel frequency response signal is further processed in the DSP module 130, as shown in FIG. 1.

The receiver can be produced on a single IC. Such an implementation allows the various elements to be better matched that is generally possible using discrete elements or multiple ICs. The steps of the method 700 may be embodied in hardware, in a software module executed by a processor, or in a combination of the two. The various steps may be performed in the order shown, or may be omitted or one or more process steps may be added to the method. An additional step, block, or algorithm may be added in the beginning, end, or intervening elements of the method.

Figure 8:
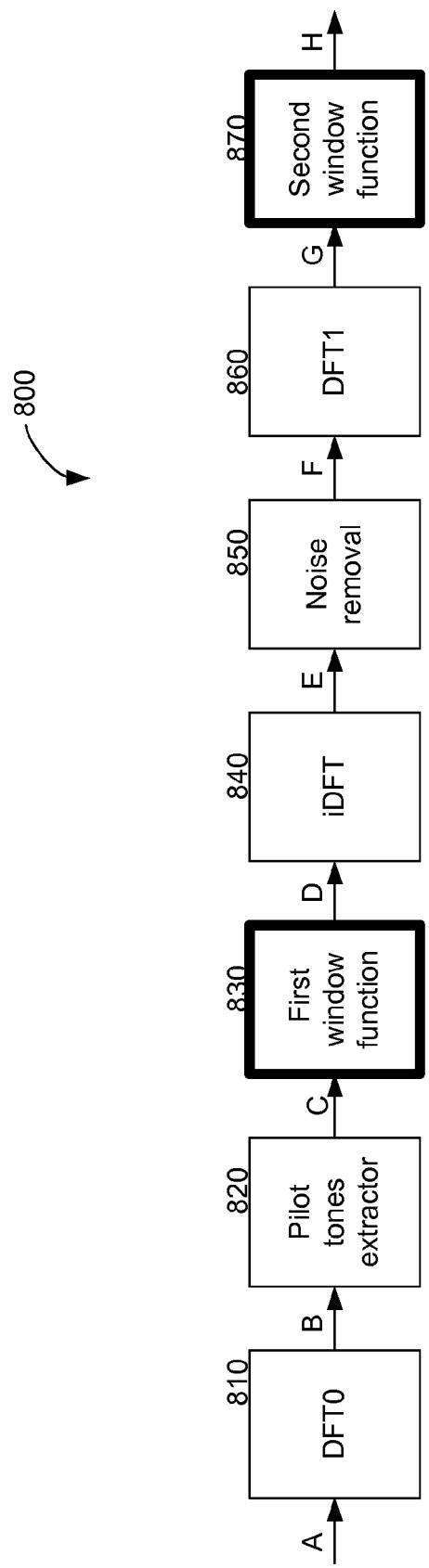
FIG. 8 is a block diagram of a system for estimating a channel frequency response, according to an embodiment of the present invention.

FIG. 8 is a simplified block diagram illustrating the processing stages of a system 800 for estimating a channel frequency response, according to an embodiment of the present invention. System 800 is shown as including a transform block 810 that receives digital baseband signal A in the time domain and transforms it to a digital frequency-domain signal B by performing a discrete Fourier Transform or a Fast Fourier Transform operation. The frequency-domain signal B includes at least an OFDM symbol having a plurality of data carriers and a plurality of scattered pilot tones.

The receiver further proceeds to pilot tones extractor block 820 and extracts the scattered pilot tones from the OFDM symbol. In an embodiment, the receiver does not need to receive all scattered pilot tones in the OFDM symbol. In the event that some scattered pilot tones cannot be received due to a frequency-selective channel, the receiver can reconstruct the missing pilot tones by replacing them using the received adjacent pilot tones or by interpolating the received adjacent pilot tones.

In an embodiment, the pilot tones may be dispersed among the data carriers at a regular or variable frequency interval. The pilot tone extractor block 820 extracts a subset of pilot tones C from the received and/or reconstructed pilot tones. The subset of pilot tones C may include a portion of or the entire number of pilot tones in the OFDM symbol. The extracted pilot tones C are then multiplied (filtered) by a first window function (filter) in a window function logic block 830 to reduce the spectral leakage of the pilot tones. In an embodiment, the window function can be a Hamming Window, a Hann (also known as Hanning) Window, and the like. In a preferred embodiment, the window function is a Hann Window function that can be represented by the following equation (1):

$$w(n)=(1-\cos(2\pi n/N-1)) \text{ if } |n|<N \text{ and } w(n)=0 \text{ otherwise} \quad (1)$$

Figure 9A:
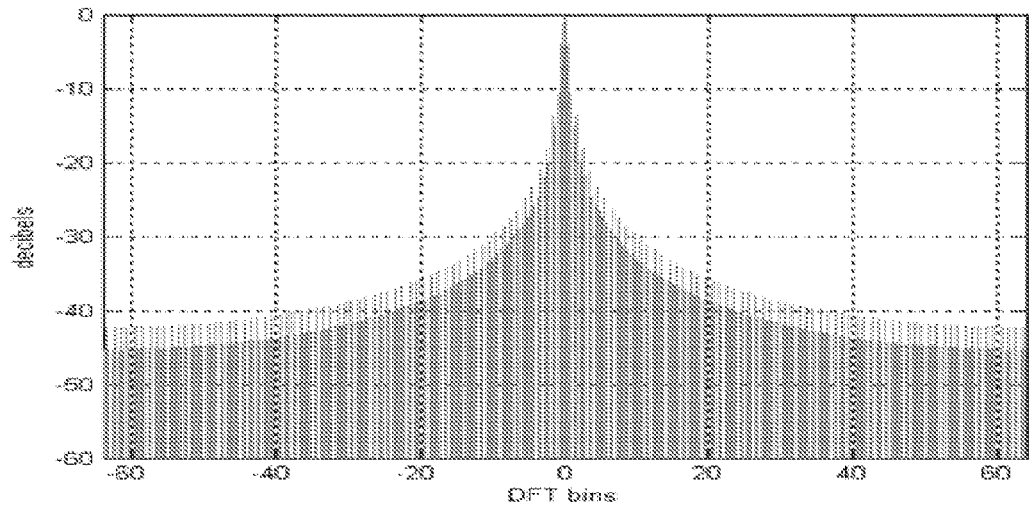
FIG. 9A is a waveform illustrating a spectral leakage, as known in the prior art.
Figure 9B:
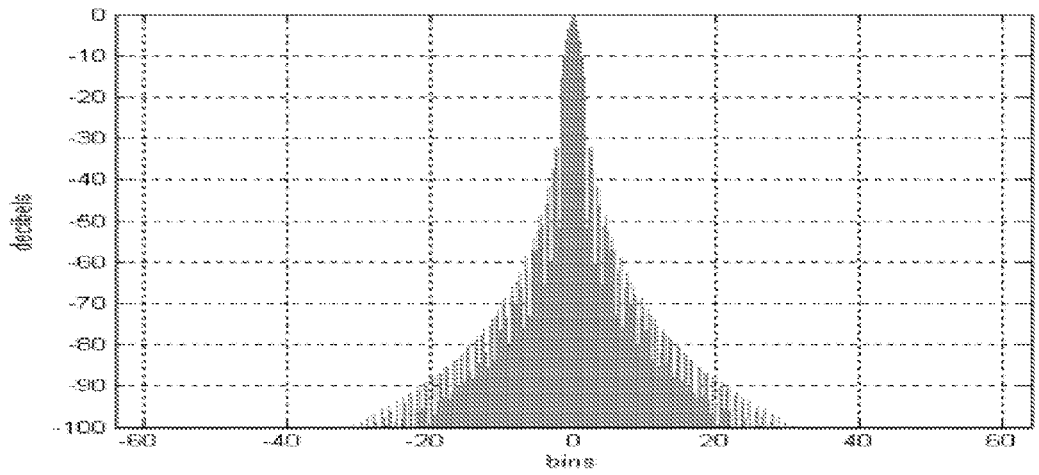
FIG. 9B is a waveform illustrating a spectral leakage according to an embodiment of the present invention.

FIG. 9A illustrates the waveform of the spectral leakage as known to the prior art while FIG. 9B illustrates the waveform of the spectral leakage according to an embodiment of the present invention. As shown in FIG. 9B, the signal loss is significantly reduced when the extracted pilot tones are filtered (multiplied) with a Hann Window function. In other words, the Hann Window function enables the spectral energy of the pilot tones to concentrate around the main tap (at the "0" bin) so that a subsequent noise removal block 850 only removes noises so that the adjacent precursor and post-cursor taps that are part of a channel impulse response are not removed. In contrast, the frequency bins of the prior art shown in FIG. 9A extend far beyond the main bin.

Figure 10:
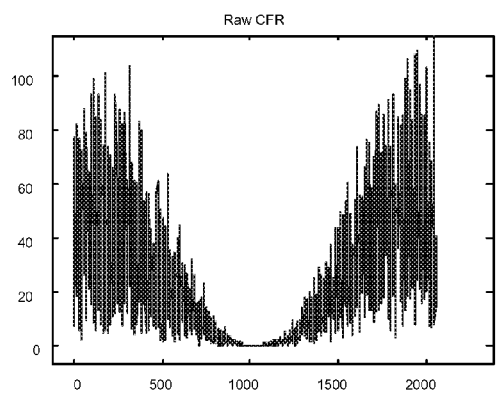
FIG. 10 is a diagram illustrating the extracted pilot tones at the output of the pilot extractor block according to an embodiment of the present invention.

FIG. 10 illustrates the spectrum density of the extracted pilot tones D after being filtered by a Hann window function 830. The x-axis is shown in frequency (Hz) and the y-axis is given for a normalized power spectrum density in dB. As can be seen clearly, the raw channel frequency response is free from noise around the center (1100 Hz) whereas the raw channel frequency response of the conventional art has a noise spectrum at the center having relatively high power values.

Figure 4:
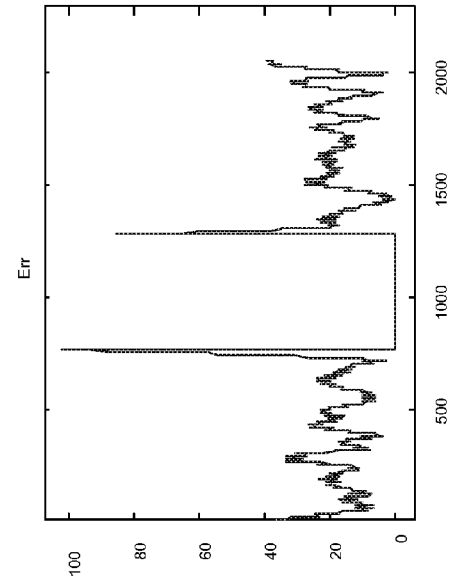
FIG. 4 is a channel impulse response signal at the output of the noise removal block of FIG. 2, as known in the prior art.
Figure 11:
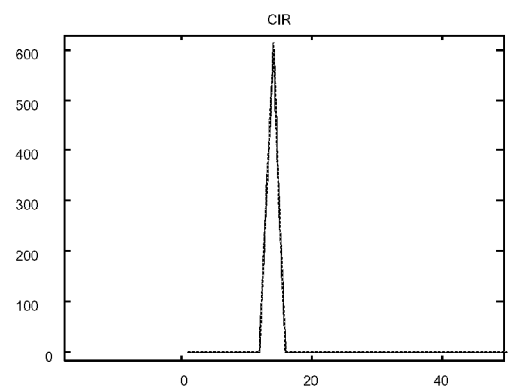
FIG. 11 is a channel impulse response signal at the output of the noise removal block according to an embodiment of the present invention.

FIG. 11 is a waveform illustrating the then obtained channel impulse response F with reduced noises. The x-axis is shown in delay time in ns and the y-axis is given for a normalized power spectral density in dB. As shown in FIG. 11, the channel impulse response signal F comprises a main tap, other precursor and post-cursor taps are insignificant or non-existent. In contrast, precursor and post-cursor taps are present in the prior art (shown in FIG. 4) so that a noise removal using window and threshold separator may remove not only noises, but also other taps that contain useful information about the channel impulse response signal.

Referring back to FIG. 8, the inverse discrete Fourier Transform block 840 receives the filtered pilot tones D and generates a time-domain signal E with N elements corresponding to the N sample values of the window function 830 in Equation (1). It is noted that the inverse discrete Fourier Transform can be realized as a Fast Fourier Transform algorithm in an embodiment.

The N sample values (taps) are then converted into corresponding positive values and compared with a predetermined power level. In an embodiment, noise removal block 850 may include a band-pass filter that passes the main tap and its adjacent taps (precursor and post-cursor taps), an absolute value converter that converts the passed taps into an amplitude having a positive value, and a threshold comparator that identifies values that equal or exceed a predetermined level. Thus, taps having amplitude or power level lower than the predetermined level will be filtered out. In an embodiment, the channel impulse response signal F after the noise removal block 850 is noise free.

A discrete Fourier Transform block 860 transforms the channel impulse response signal F into a frequency-domain signal G, which is then multiplied (filtered) with a second window function provided in logic block 870. It is noted that the discrete Fourier Transform and inverse Fourier Transform blocks can be implemented in hardware, in a software module executed by a digital signal processor, as shown in FIG. 1.

Figure 5:
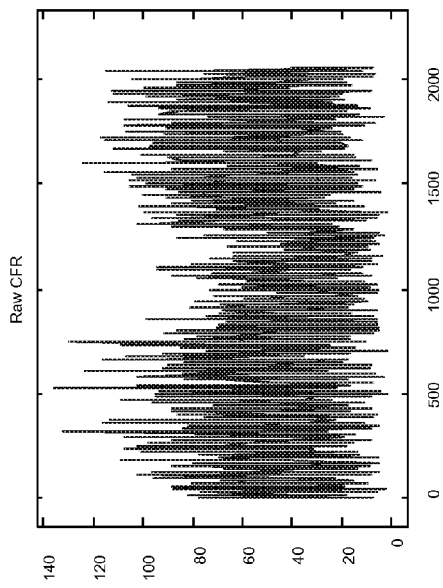
FIG. 5 is a channel frequency response signal at the output of the second discrete Fourier Transform block of FIG. 2, as known in the prior art.
Figure 12:
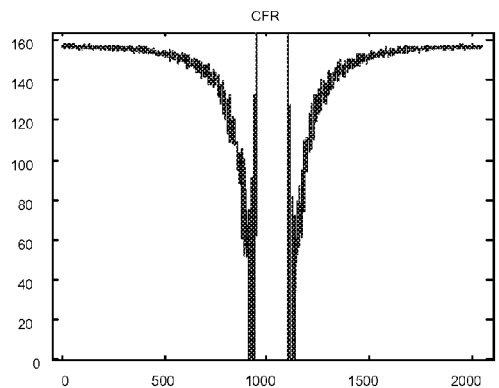
FIG. 12 is a channel frequency response signal at the output of the second discrete Fourier Transform block according to an embodiment of the present invention.

FIG. 12 is a waveform illustrating the then obtained channel frequency response signal H at the output of the second window function 870. The x-axis is given in frequency (Hz) and the y-axis is given for a normalized power spectral density in dB. As can be seen, the spectral density of the estimated channel frequency response has 0 db and is flat at the center frequency (around 1100 Hz in this example embodiment) comparing to the waveform obtained using conventional channel estimation techniques (see FIG. 5).

Figure 6:
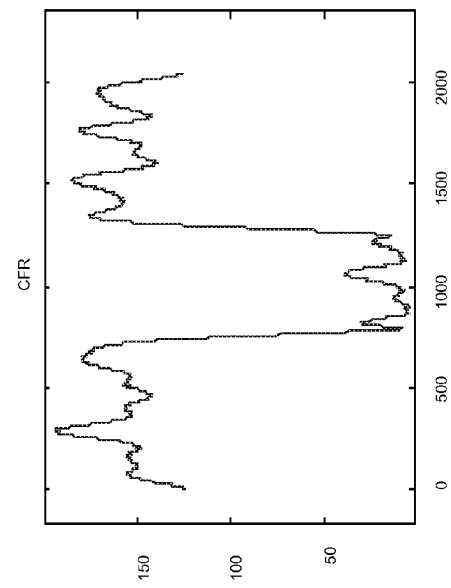
FIG. 6 is a diagram showing the error of the estimated channel response against a channel response under ideal channel conditions (i.e., a 0 dB AWGN channel), as known in the prior art.
Figure 13:
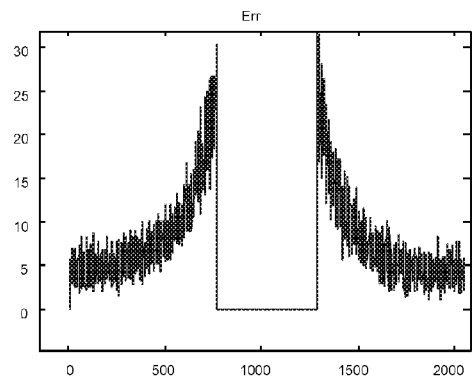
FIG. 13 is a diagram showing the error of the estimated channel response against a channel response under ideal channel conditions according to an embodiment of the present invention.

FIG. 13 is a waveform diagram illustrating the error of the estimated channel frequency response against a 0 dB AWGN channel (ideal channel conditions). Comparing with that shown in FIG. 6 of the prior art, the spectral density error is much lower (e.g., 30 dB vs. 100 dB of the prior art). The substantial reduction in the spectral density error of the present invention is due to the addition of the first and second window functions shown as logic blocks 830, 870 in system 800. It is appreciated that logic blocks can be implemented in hardware, software, or a combination thereof. Although the blocks are shown as discrete functions in the Figures, they can be combined and/or shared in some embodiments. For example, a same hardware circuit and a software module can be used to perform functions or operations of blocks 810, 840, and 860.

In another embodiment, the time-domain and frequency-domain transformations, the window function, pilot tone extraction, noise removal functions described above as individual steps in FIG. 7 or as logic blocks in FIG. 8 can be performed by a general-purpose or a application-specific digital signal processor shown as the DSP block 130 coupled with a memory block 140 in FIG. 1.

Those of skill in the art would appreciate that the various logical blocks described in connection with the embodiments disclosed herein may be implemented as electronic hardware, software, firmware, or a combination thereof. Whether a function is implemented as hardware, software, or firmware including program codes and memory and digital signal processing circuitry depends on the particular application, design and/or cost constraints imposed on the overall system.

The various illustrative logical blocks and steps of a method described in connection with the embodiments discloses herein may be implemented with a general purpose microprocessor, a digital signal processor, an application specific integrated circuit (ASIC), a field programmable gate array (FPGA), or any combination thereof.

Suitable memory modules may include hard-disk drive, flash memory, read-only-memory (ROM), static and/or dynamic RAM, and the like. The computer executable instructions may be written in a suitable computer language or combination of several languages.

Thus, the disclosed embodiments of the present invention are not intended to be limited to the embodiments shown herein, and that various modifications or changes in light thereof will be suggested to those of skill in the art and are to be included within the spirit and purview of this application and scope of the appended claims.

What is claimed is:

1. A computer-implemented method of estimating a channel in a pilot assisted OFDM system, the computer-implemented method comprising:
    receiving an RF signal;
    down-converting the RF signal to a baseband signal;
    converting the baseband signal to a digital baseband signal;
    converting the digital baseband signal to a frequency-domain signal, the frequency-domain signal including an OFDM symbol having a plurality of data carriers and a plurality of pilot tones;
    extracting at least a subset of the plurality of pilot tones;
    filtering the extracted pilot tones;
    obtaining a channel impulse response from the filtered pilot tones, the channel impulse response comprising a plurality of taps;
    selecting a number of taps from the plurality of taps;
    converting the selected number of taps into a channel frequency response; and
    filtering the channel frequency response.

2. The computer-implemented method of claim 1, wherein the filtering of the extracted pilot tones comprises using a first window function.

3. The computer-implemented method of claim 2, wherein the first window function comprises a Hann Window function.

4. The computer-implemented method of claim 2, wherein the filtering the channel frequency response comprises using a second window function that is an inverse of the first window function so that the product of the first and second window functions is substantially equal to unity.

5. The computer-implemented method of claim 1, wherein the selecting the number of taps from the plurality of taps comprises:
    converting each of the plurality of taps to a positive value;
    comparing the positive value with a predetermined level; and
    selecting taps having a value equal or greater than the predetermined level.

6. The computer-implemented method of claim 1, wherein the obtaining a channel impulse response comprises a Fourier Transform operation.

7. The computer-implemented method of claim 1, wherein the plurality of pilot tones are spaced in an equal frequency amount apart within the OFDM symbol.

8. An OFDM receiver for estimating a channel, comprising:
    an RF front-end module having an input for receiving an RF signal and an output for outputting a baseband signal;
    an analog-to-digital converter coupled to the RF front-end module and configured to convert the baseband signal into a digital baseband signal; and
    a digital signal processing module comprising:
        a frequency-domain converter configured to convert the digital baseband signal into a frequency-domain signal, the frequency-domain signal including an OFDM symbol having a plurality of data carriers and a plurality of pilot tones;
        a pilot extractor configured to extract a portion or the entire plurality of pilot tones in the OFDM symbol;
        a first filter configured to assign a first weight to the extracted pilot tones;
        a time-domain transformer configured to obtain a channel impulse response from the weighted pilot tones, the channel impulse response comprising a plurality of taps;
        a noise remover configured to select a number of taps from the plurality of taps, each of the selected number of taps having a value being equal to or greater than a predetermined level; and
        a channel frequency estimator configured to estimate a channel frequency response based on the selected number of taps; and
        a second filter configured to provide a second weight to the estimated channel frequency response.

9. The OFDM receiver of claim 8, wherein the first filter comprises a first window function.

10. The OFDM receiver of claim 9, wherein the first window function comprises a Hann window function.

11. The OFDM receiver of claim 8, wherein the noise remover comprises a combination of a level comparator and a window limiter.

12. The OFDM receiver of claim 8, wherein the second filter is an inverse of the first filter so that the product of the first and second filters is substantially equal to unity.

13. The OFDM receiver of claim 8, wherein the noise remover comprises:
    a bandpass filter configured to pass through a plurality of taps;
    an absolute value converter configured to convert each of the plurality of taps into a positive value; and
    a comparator configured to compare the positive value with a predetermined value.

14. A digital signal processor comprising:
an input configured to receive a digital signal;
a processor; and
a non-transitory computer readable storage medium comprising instructions is executed by the processor, the processor is configured to:
convert the digital signal into a frequency-domain signal, the frequency-domain signal including an OFDM symbol having a plurality of data carriers and a plurality of pilot tones;
extract a portion of or the entire plurality of pilot tones;
filter the extracting pilot tones with a first filter;
obtain a channel impulse response from the filtered pilot tones, the channel impulse response comprising a plurality of taps;
select a number of taps from the plurality of taps, each of the selected number of taps having a value being greater than a predetermined level;
transform the selected number of taps into a channel frequency response; and
filter the channel frequency response with a second filter; and
an output configured to output the filtered channel frequency response.

15. The digital signal processor of claim 14, wherein a product of the first and second filters is substantially equal to unity.

16. The digital signal processor of claim 14, wherein the first filter comprises a Hann window function.

17. The digital signal processor of claim 14, wherein the plurality of pilot tones is scattered within the plurality of data carriers.

18. A device for estimating a channel response from a received signal that comprises a plurality of pilot tones in an OFDM communication system, the device comprising:
means for converting the received signal into a frequency-domain signal;
means for extracting a portion or the entire plurality of pilot tones,
means for filtering the extracted pilot tones with a first set of filter parameters;
means for converting the filtered pilot tones into a channel impulse response;
means for removing noises from the channel impulse response;
means for generating a channel frequency response from the noise reduced channel impulse response; and
means for filtering the generated channel frequency response with a second set of filter parameters.

19. The device of claim 18, wherein the first set of filter parameters comprises a first window function.

20. The device of claim 18, wherein the first set of filter parameters comprises a Hann Window function.

21. The device of claim 18, wherein the second set of filter parameters is an inverse of the first set of filter parameter so that their product is substantially equal to unity.

* * * * *